United States Patent
Kumano et al.

(10) Patent No.: US 7,344,805 B2
(45) Date of Patent: Mar. 18, 2008

(54) MASK AND METHOD FOR PRODUCING THEREOF AND A SEMICONDUCTOR DEVICE USING THE SAME

(75) Inventors: Hiroshi Kumano, Kyoto (JP); Yuichi Mikata, Ibaraki (JP)

(73) Assignees: Rohm Co., Ltd., Kyoto (JP); Toshiba Corporation, Tokyo (JP)

(*) Notice: Subject to any disclaimer, the term of this patent is extended or adjusted under 35 U.S.C. 154(b) by 437 days.

(21) Appl. No.: 10/741,932

(22) Filed: Dec. 18, 2003

(65) Prior Publication Data

US 2004/0155204 A1   Aug. 12, 2004

(30) Foreign Application Priority Data

Dec. 24, 2002   (JP) ............... 2002-372859

(51) Int. Cl.
*G03F 1/00*   (2006.01)
(52) U.S. Cl. ........................................ 430/5
(58) Field of Classification Search ........... 430/5, 430/30; 257/712; 250/492.1, 492.2; 136/203
See application file for complete search history.

(56) References Cited

U.S. PATENT DOCUMENTS 6,098,408 A * 8/2000 Levinson et al. ............ 62/3.2
6,727,109 B2 * 4/2004 Ju et al. ...................... 438/22
6,800,933 B1 * 10/2004 Mathews et al. ........... 257/712
6,806,006 B2 * 10/2004 Lercel et al. .................. 430/5

FOREIGN PATENT DOCUMENTS

| JP | 5-226579 | 9/1993 |
|---|---|---|
| JP | 9-205058 | 8/1997 |
| JP | 2002-203806 | 7/2002 |

* cited by examiner

*Primary Examiner*—S. Rosasco
(74) *Attorney, Agent, or Firm*—Hamre, Schumann, Mueller & Larson, P.C.

(57) ABSTRACT

A mask is provided wherein the mask has: a plate-like member having a mask pattern area and at least one pn junction; and a current supplying area which supplies a current to the pn junction, and a Peltier effect is caused by supplying a current to the pn junction, thereby enabling the temperature of the mask pattern area to be controlled. When this mask is used, reliable formation of an ion implanted region is enabled without forming a resist pattern.

25 Claims, 12 Drawing Sheets

FIG. 10
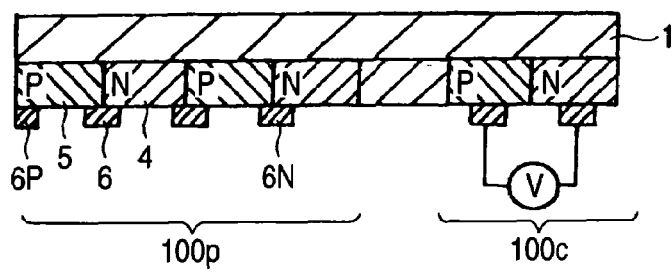
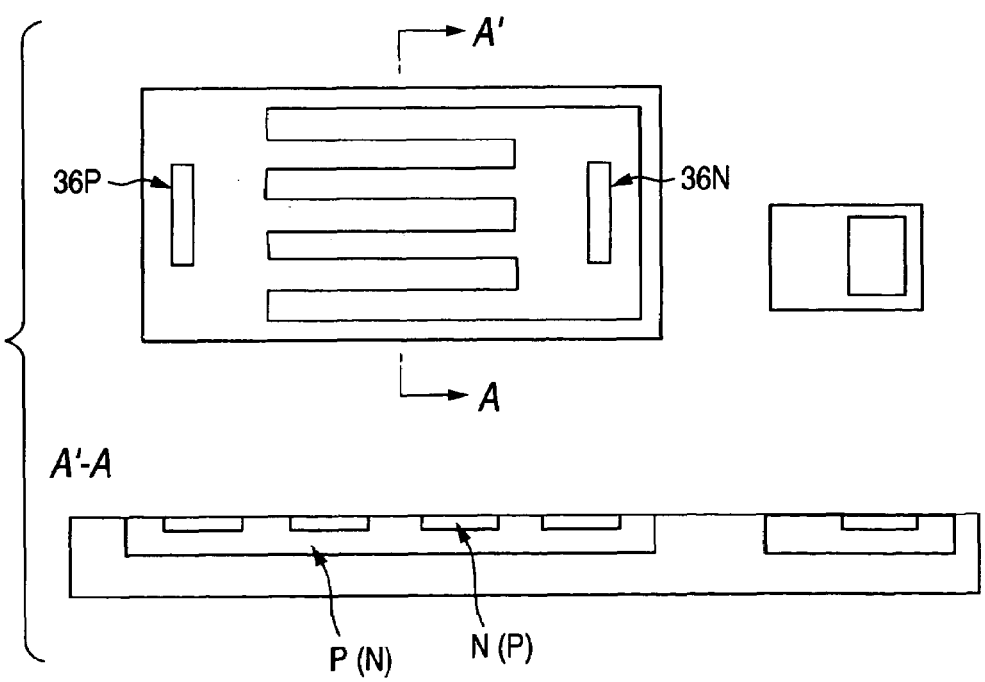
FIG. 11

MASK AND METHOD FOR PRODUCING THEREOF AND A SEMICONDUCTOR DEVICE USING THE SAME

BACKGROUND OF THE INVENTION

1. Field of the Invention

The present invention relates to a mask, a method of producing it, a method of producing a semiconductor device with using it, and a semiconductor producing apparatus, and more particularly to reduction of distortion due to a temperature rise during process steps.

2. Description of the Related Art

Recently, fine patterning and high integration of a semiconductor device are being advanced, and it is requested to develop a technique of accurately performing a subquarter micron process with good reproducibility.

In the production of a semiconductor integrated circuit (LSI), for example, several to ten ion implanting steps must be conducted in LSI forming steps such as formations of wells, channels, sour/drain regions, and contact regions. Usually, ions are implanted into an opening region of a resist pattern in the following manner. First, a resist is applied to the surface of a substrate, and a selective exposure step and a developing step are then conducted. Thereafter, a resist pattern is formed by the photolithography, and ion implantation is performed through the resist pattern.

FIGS. 18A to 18E show an example of an ion implanting step. As shown in FIG. 18A, a device isolation insulating film 12 is formed in the surface of a silicon substrate 11 by the LOCOS method to isolate device regions from one another, and a resist R is applied to the whole surface of the substrate.

As shown in FIG. 18B, an exposure process is then performed through a photomask to form an exposed region, and, as shown in FIG. 18C, the resist in the exposed region is removed away by development, thereby forming a resist pattern R.

As shown in FIG. 18D, ion implantation is performed through the resist pattern R to form an ion implanted region 13.

Finally, the resist pattern R is removed away, and a thermal diffusion process is performed, whereby the ion implanted region 13 (diffused region) of a desired depth is formed as shown in FIG. 18E.

As described above, resist application, patterning by exposure and development, and film separation after ion implantation are usually necessary, and many steps are required. Moreover, a wet step must be conducted, and hence there is a serious problem in that the surface of the substrate is contaminated.

In the case where a pattern is formed by a process including such a lithography step, the exposure step is performed through a pattern which is once printed onto an exposure mask, thereby causing another problem of a reduced accuracy due to transfer.

It has been proposed to use a stencil mask in a charged particle beam or electron beam exposure apparatus which is known as one of semiconductor production techniques.

The direct lithography technique in which an electron beam or the like is scanned to directly write fine patterns onto a wafer (semiconductor substrate) requires a very long process time. In order to shorten the process time, therefore, an operation of scanning an electron beam along a pattern is not conducted, and a mask (stencil mask) having an opening pattern is used so that an electron beam or the like selectively impinges on a wafer (semiconductor substrate).

This mask technique may be applied to the ion implantation technique. In this case, when a stencil mask is used in place of a resist mask in a process of ion implantation, an ion beam can be selectively introduced into a wafer (substrate). Therefore, the patterning steps of resist application, exposure, and development, and other steps such as resist separation after ion implantation can be omitted. Furthermore, since a wet step is not conducted, the surface of a wafer is not contaminated, and the pattern formation process in a short time is enabled.

In this case, however, ions directly impinge on the mask, and hence the temperature of the mask is largely raised, so that members constituting the mask are greatly expanded to be warped or deformed, thereby causing a problem in that the pattern accuracy is lowered.

In (a) and (b) of FIG. 20, displacements of a stencil mask M at ordinary and high temperatures are schematically shown. It will be seen that, at a high temperature, the displacement d (flexure of the mask) is large, and the opening position and opening accuracy of a pattern are very largely deviated.

FIGS. 21 and 22 show respectively measurement results of the temperature rise of a stencil mask and displacement (flexure) of a membrane area in the case where ions were implanted into the surface of a wafer (semiconductor substrate) through the stencil mask M in which, as shown in FIG. 19, a thermocouple K was placed in the middle of the membrane area of an area of 30 mm$^2$ and a thickness of 10 .m.

In the ion implantation, boron ions were implanted under the conditions that the energy was 90 keV and the dose amount was 2E13 ions/cm$^2$, while changing the beam power.

As apparent from FIGS. 21 and 22, the ion beam implantation causes the temperature of the stencil mask to be largely raised, and displacement to occur.

As described above, the conventional art has a problem in that accurate pattern formation cannot be performed with using a stencil mask.

This problem is caused not only in techniques relating to ions, such as ion implantation and ion beam etching, and also in a charged particle beam or electron beam exposure step, an etching step, and a film growing step. As fine patterning is further advanced, even a slight temperature change causes a larger problem.

SUMMARY OF THE INVENTION

The invention has been conducted in view of the aforementioned circumstances. It is an object of the invention to provide a mask which is highly accurate and reliable, and in which warp or deformation does not occur.

It is another object of the invention to provide a (stencil) mask which enables accurate ion implantation to be performed in the ion implantation technique.

It is a further object of the invention to provide a mask for a semiconductor process step which can form an accurate pattern.

It is a still further object of the invention to provide a method of producing a mask which can be easily produced, and which is highly reliable.

It is a still further object of the invention to provide an ion implanting method and an ion implanting apparatus which are highly accurate and reliable, and in which formation of a resist pattern is not required.

It is a still further object of the invention to provide an etching method or a film growing method which is highly accurate and reliable, and in which formation of a resist pattern is not required.

[Means for Solving the Problems]

The mask of the invention is characterized in that the mask comprises: a plate-like member having a mask pattern area and a pn junction; and a current supplying area which supplies a current to the pn junction, and a Peltier effect is caused by supplying a current to the pn junction, thereby enabling a temperature of the mask pattern area to be controlled.

In the invention, a current is supplied to the pn junction to cause the Peltier effect, whereby the temperature of the mask itself can be controlled. When a current is supplied to the pn junction in the direction from the n-type region to the p-type region, electrons move from the junction surface (an electrode on the side of the junction surface) to the n-type region, try to pass through the n-type region while absorbing an energy for passing through the n-type region, from the electrode on the side of the junction surface, and pass through the n-type region while emitting the energy to an electrode (current electrode) on the side of the other end of the n-type region. By contrast, holes move from the junction surface (the electrode on the side of the junction surface) to the p-type region, try to pass through the p-type region while absorbing an energy for passing through the p-type region, from the electrode on the side of the junction surface, and pass through the p-type region while emitting the energy to an electrode (current electrode) on the side of the other end of the p-type region. As a result, the side of the junction surface falls short of energy, and the temperature is lowered. When the direction or the amount of the current to be supplied to the pn junction is controlled, therefore, the heat transport can be controlled so as to adjust the temperature of the mask to a desired level. The direction or the amount can be easily controlled by an electrical control. Consequently, the temperature can be precisely adjusted, so that a pattern on the mask can be prevented from being deviated and accurate pattern formation can be realized.

According to the invention, a mask to be used in an application in which a temperature rise due to collision of ions easily occurs, such as an ion implantation mask may be configured so that the mask pattern area is caused to function as a cooling surface by the Peltier effect. In this configuration, pattern formation in which warp or distortion is prevented from occurring, and which is highly reliable is enabled. Therefore, this configuration is very effective.

When the plate-like member comprises: a thin membrane area having the mask pattern area; and a frame-like support area which is formed in a periphery of the membrane area, the plate-like member is easy to handle. In the case of formation of a CMOS device, p- and n-wells must be formed, and two steps of forming a resist pattern are required. In a conventional method, resist applying and patterning steps for implanting impurity ions of one conductivity type are conducted, the ions are implanted, and a resist is then removed away. Thereafter, resist applying and patterning steps for implanting impurity ions of another conductivity type are conducted, the ions are implanted, and a resist is then removed away. Therefore, a wafer must be subjected to a large number of wet processes, and operations of loading and unloading the wafer from a chamber involves many contamination causes.

By contrast, when the mask of the invention is used, the support area can be gripped, and hence the mask can be freely attached or detached in a processing apparatus such as an ion implanting apparatus. Therefore, plural ion implantation processes are enabled while replacing the mask with excellent workability, so that the workability can be remarkably improved.

Preferably, the membrane area and the support area are configured by a single semiconductor substrate. According to the configuration, the temperature can be easily controlled by means of heat conduction, and distortion due to heat can be suppressed from occurring.

When the membrane area is configured by a silicon thin substrate, a pn junction can be easily accurately formed by a usual semiconductor process. Also when the membrane area is used as a mask in a semiconductor process, it does not cause contamination in a processing apparatus such as an ion implanting apparatus, because the mask is made of the same element as that of the object to be processed.

When the pn junction is configured by stripe-like p- and n-type impurity regions which are formed in a surface of the plate-like member to be parallel with each other, and formed on a plane which is perpendicular to a surface of the membrane area, the junction circumferential length can be increased by applying microprocessing. This configuration has an advantage that a mask of a high temperature control efficiency can be provided.

When, as shown in FIG. 11, the pn junction is configured by a relatively shallow diffusion pattern which is formed in a comb tooth-like shape in a well region that is relatively deeply formed in a surface of the plate-like member, the area of the pn junction can be increased to the maximum degree, so that the temperature can be efficiently controlled.

In the case where the pn junction is formed at a predetermined depth from a surface of the plate-like member and in parallel with the surface, the pn junction exists at a uniform density with respect to the surface, and hence the temperature distribution in the face direction can be uniformalized. Moreover, the pn junction is formed at a deep position, and therefore the pn junction characteristics are hardly affected by residual ion beam impurities in the vicinity of the surface of the membrane area. Consequently, it is possible to provide a mask which has stabilized temperature control characteristics and high reliability.

Preferably, a temperature detecting area which is configured by a pn junction may be formed on the semiconductor substrate constituting the mask. According to the configuration, the temperature can be accurately detected, and a precision temperature control can be efficiently performed.

When the pn junction of the temperature detecting area is configured by a diffusion layer which is formed in a same step as a diffusion layer constituting the pn junction of the membrane area, accurate temperature detection can be performed more easily. Since the temperature can be efficiently controlled, it is possible to form an accurate mask which is free from warp or distortion.

Preferably, the temperature detecting area may be formed on a surface of a support area (beam or frame) which is formed to be thicker than the membrane area. According to the configuration, it is possible to provide a mask the strength of which is stabilized.

When the pn junction is formed in the mask pattern area, the temperature of the mask pattern area in which a temperature change occurs easily in processing steps can be accurately detected. Therefore, the temperature can be controlled more accurately, and it is possible to provide a mask which is free from deviation or deformation.

When the pn junction is formed in a partial support area (beam) which is formed in a region of the membrane pattern area excluding the openings, and which has a thickness that is substantially equal to a thickness of the frame-like support area, the temperature detecting area is formed so as to function also as the support area. Therefore, it is possible to configure a mask which is high in rigidity and reliability.

When the pn junction is formed in the partial support area (beam), and on a plane which is at a deep position and parallel with a surface of the membrane area, it is possible to provide a mask in which the pn junction characteristics are hardly affected by residual ion beam impurities in the vicinity of the surface of the membrane area, and which has a longer life.

When the pn junction is formed in the partial support area (beam), and on a plane which is perpendicular to a surface of the membrane area, the junction circumferential length can be increased by applying microprocessing. This configuration has an advantage that a mask of a high cooling efficiency can be provided.

When the membrane area is configured by a silicon carbide substrate, a mask of reduced deformation can be formed even by a current or temperature control which is not relatively accurate. Therefore, it is possible to provide a highly reliable mask of a simpler configuration.

When the membrane area is configured by a diamond substrate, the membrane area is hard, difficult to be sputtered, and stable, thereby providing a feature that the membrane area hardly causes contamination. Since the heat conductivity is high and the electrical insulation can be maintained, a high degree of freedom is provided in the mask design.

The method of producing a mask of the invention is characterized in that the method comprises the steps of: implanting impurity ions into a surface of a semiconductor substrate to form at least one pn junction; forming a pattern area in the surface of the semiconductor substrate; and forming a current supplying area which supplies a current to the pn junction so as to cause a Peltier effect. The pattern area of the mask is configured by an assembly of openings. Alternatively, depending on the use conditions, the pattern area may be configured by regions transparent to light or ions, and nontransparent regions, and may not be configured by holes.

According to the method, a mask can be easily formed by a usual thin film process.

The method of producing a semiconductor device of the invention characterized in that the method comprises: a step of positioning the aforementioned mask on a surface of a to-be-processed substrate, and attaching the mask to the surface; and a process step of selectively applying a physical process or a chemical process through the mask to the to-be-processed substrate.

According to the method, a desired pattern can be accurately formed without conducting a photolithography step, and with using a mask having the Peltier effect while controlling the temperature of the surface of the mask. In the above, the process means processes of film growth, etching, and reformulation (exposure, implantation, or the like), the physical process includes a chemical process such as exposure, and sputtering and other processes, and the chemical process includes a film growth process such as CVD, an etching process such as RIE, and other processes.

When, in the process step, ions are selectively implanted into the surface of the to-be-processed substrate, in regions corresponding to the openings of the mask, the ion implantation can be performed in a state where the temperature rise of the mask is prevented from occurring by the Peltier effect and the mask is free from warp and distortion.

The process step may include the steps of: attaching a first mask in which a desired opening pattern is formed, to the surface of the to-be-processed substrate, and implanting first impurity ions into the surface of the to-be-processed substrate, in regions corresponding to openings of the first mask; and attaching, in place of the first mask, a second mask to the surface of the to-be-processed substrate into which the first impurity ions are implanted, and implanting second impurity ions into the surface of the to-be-processed substrate, in regions corresponding to openings of the second mask. According to the configuration, ion implantation in a CMOS process can be very simplified, and accurate impurity regions which are highly reliable can be formed with excellent workability.

Preferably, the process step may include an exposure step of selectively exposing a resist formed on the surface of the to-be-processed substrate, in regions corresponding to the openings of the mask. This configuration may be applied to, electron beam (EB) exposure using an exposure mask. According to the configuration, the mask is always held to a constant temperature, and hence distortion due to heat does not occur, so that an accurate mask pattern can be maintained. Therefore, the exposure step in which the pattern has been written by beam scanning can be realized by whole surface exposure through the mask. As a result, the workability is very excellent, the exposure step can be conducted for a short time, and the reproducibility and controllability are high.

Preferably, the process step may include a step of selectively etching the surface of the to-be-processed substrate, in regions corresponding to the openings of the mask. According to the configuration, etching is enabled without conducting a photolithography step. In the case where this configuration is applied to gas phase etching, particularly, contamination can be prevented from occurring, and the reliability can be improved because a wet step is not required.

Preferably, the process step may include a film growing step of selectively forming a thin film on the surface of the to-be-processed substrate, in regions corresponding to the openings of the mask. According to the configuration, both a photolithography step and a pattern etching step are not required, and a highly reliable pattern formation can be performed.

The semiconductor producing apparatus of the invention is characterized in that the apparatus comprises: the aforementioned mask; a positioning section which positions the mask on a surface of a to-be-processed substrate, and attaches the mask to the surface; anion implanting section which implants impurity ions into the surface of the to-be-processed substrate through the mask; and a controlling section which controls a current supply to the pn junction so that a temperature of the mask is constant.

According to the apparatus, formation of an ion implanted region which is accurate and has high reliability can be realized with very high workability.

In the case where processes are to be performed while controlling the temperature, relationships between the current level and the degree of the temperature rise may be previously measured, so that a current of a level at which a desired temperature difference is caused can be supplied. Therefore, the temperature can be controlled with excellent workability, and a control to a constant temperature can be realized.

BRIEF DESCRIPTION OF THE DRAWINGS

FIG. 10 is a view showing a mask of a second embodiment of the invention.

FIG. 11 is a view showing a mask of a third embodiment of the invention.

DESCRIPTION OF THE PREFERRED EMBODIMENTS

Next, embodiments of the invention will be described in detail with reference to the accompanying drawings.

First Embodiment

Figure 1:
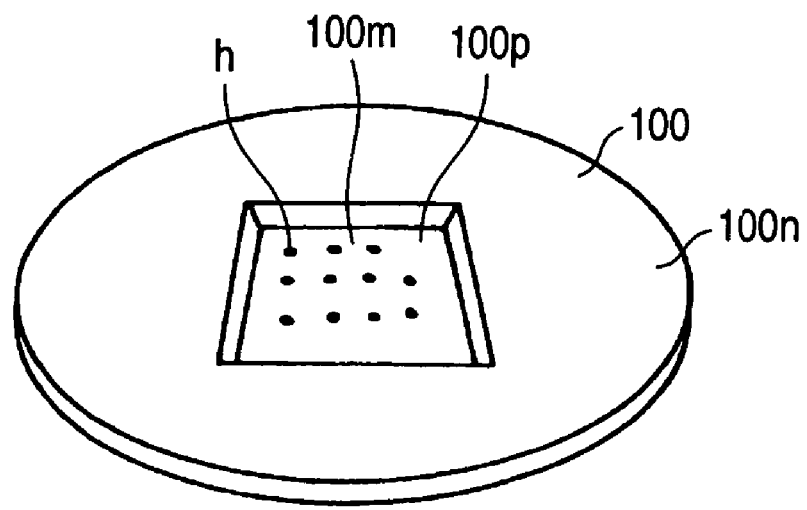
FIG. 1 is a view showing a mask which is used in a first embodiment of the invention.
Figure 2:
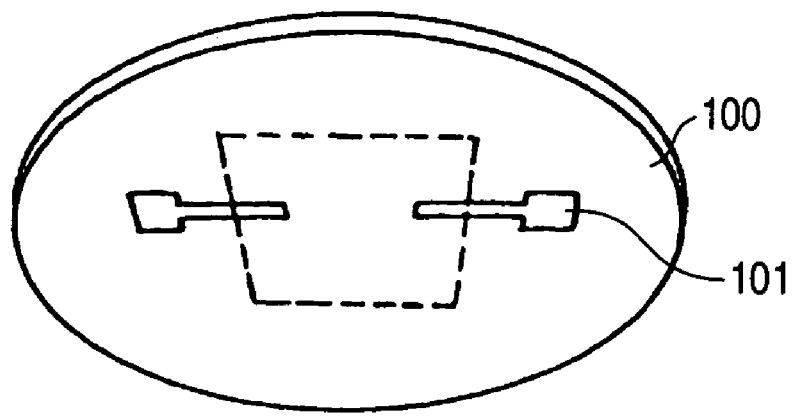
FIG. 2 is a view showing the mask which is used in the first embodiment of the invention.
Figure 3:
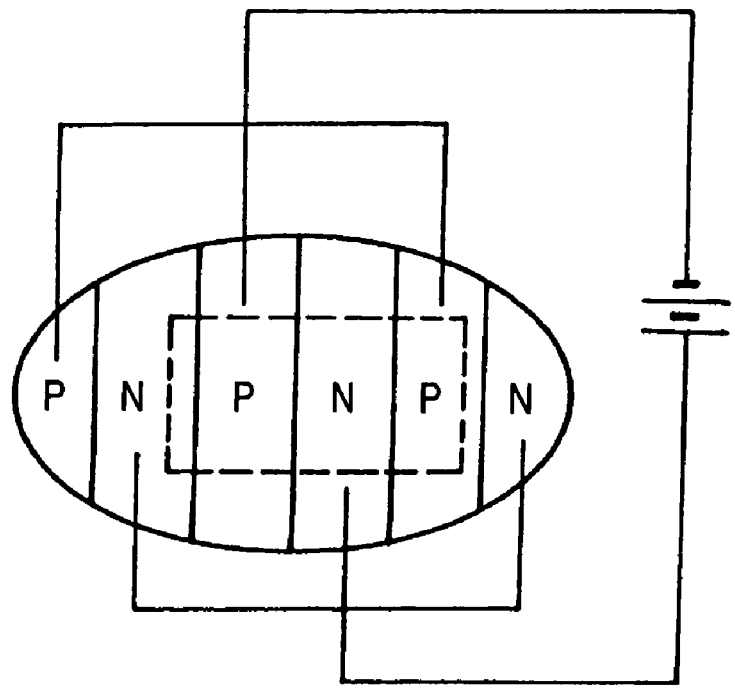
FIG. 3 is a diagram illustrating the mask.

As shown in FIGS. 1 and 2 (FIG. 1 is a perspective view, and FIG. 2 is a perspective view looking from the rear face side), an impurity implantation mask 100 of the first embodiment is configured by an SOI substrate, and comprises a membrane area 100m in the middle, and a frame-like support area 100n surrounding the area. The membrane area has a mask pattern area 100p in which a pattern is formed by holes h. The mask is characterized in that, as shown in a diagram of FIG. 3, a substantially whole face of the membrane area constitutes a Peltier element having a pn junction, and, when a current supply is performed on the pn junction, a current flows through the pn junction to cause the Peltier effect, so that the temperature of the membrane area can be controlled. The current supply to the pn junction is performed through pads 101 which are formed on the rear face of the mask as shown in the perspective view of FIG. 2 looking from the rear face side. A water cooling mechanism is disposed so as to be in contact with the outer or upper side of the frame-like support area 100n, thereby cooling the high temperature side.

Figure 4:
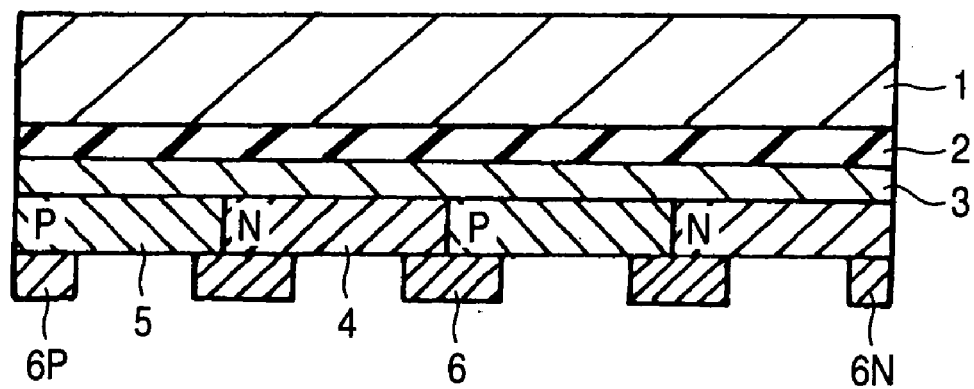
FIG. 4 is a section view of the mask.

In the impurity implantation mask, as shown in a section view of main areas in FIG. 4, n-type impurity regions 4 and p-type impurity regions 5 are alternately formed in a stripe-like shape in the surface of a non-doped silicon layer 3 which is formed via a silicon oxide film 2 on the surface of a silicon substrate 1, and a pn junction which is in parallel with the surface of the substrate is formed to a predetermined depth from the substrate surface. The reference numerals 6P, 6N denote contact patterns each configured by an aluminum layer. A Peltier pattern 6C configured by a metal layer for making an ohmic contact with both the n- and p-type impurity regions 4 and 5 is formed so as to extend over the n- and p-type impurity regions 4 and 5.

Even when the Peltier pattern 6C is not formed, the Peltier element is enabled to operate by using a voltage in a range where the pn junctions can break down. In the case of about 1E15, the pn junction breaks down at about 7 V, and, in the case of about 1E16, breaks down at about 1 V. Therefore, the working voltage range as a Peltier element can be determined in accordance with the breakdown voltage of the pn junction.

Next, a method of producing the impurity implantation mask will be described with reference to FIGS. 5A to 5E.

First, a non-doped silicon substrate is bonded by the direct bonding method to the silicon substrate 1 via the silicon oxide film 2 formed on the surface of the substrate, and then polished to a desired thickness, whereby the non-doped silicon layer 3 is formed (formation of the SOI substrate).

Figure 5A:
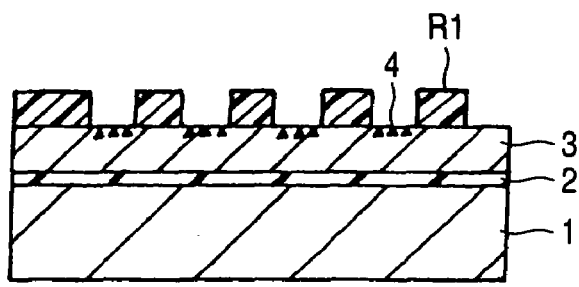
FIGS. 5A to 5E are views showing steps of producing the mask.

While using the SOI substrate as a starting material, as shown in FIG. 5A, a first resist pattern R1 is formed by the photolithography method, and n-type impurity ions are implanted with using the first resist pattern R1 as a mask to form the n-type impurity regions 4.

Figure 5B:
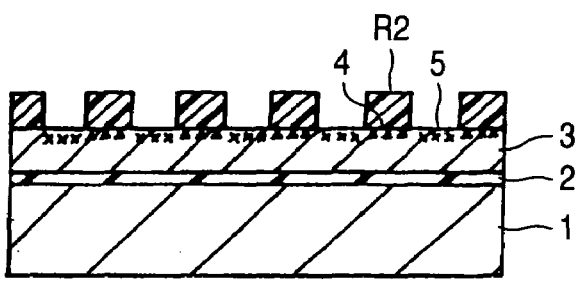

As shown in FIG. 5B, the first resist pattern R1 is then peeled off, a second resist pattern R2 is formed by the photolithography method, and p-type impurity ions are implanted with using the second resist pattern R2 as a mask to form the p-type impurity regions 5.

Figure 5C:
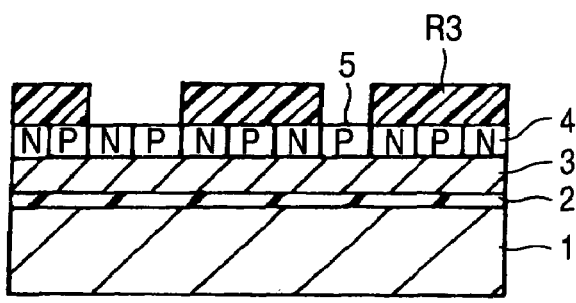

The second resist pattern R2 is then peeled off, and activation such as RTA is performed at 1,000.C for about 30 seconds. As shown in FIG. 5C, thereafter, a third resist pattern R3 for forming a mask pattern is formed by the photolithography method.

Then, an etching process is performed by RIE with using the third resist pattern R3 as a mask and the silicon oxide film 2 as an etching stopper, thereby forming the holes h.

Figure 5D:
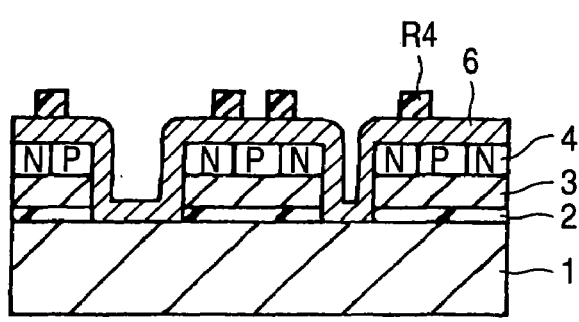
Figure 5E:
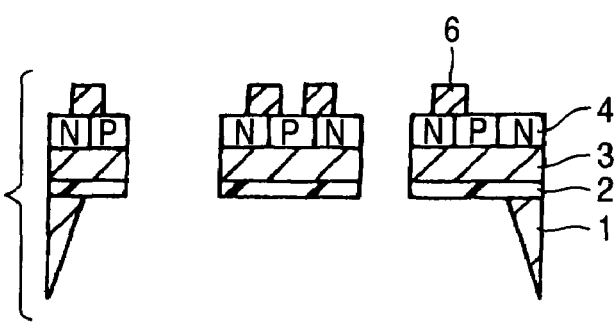

The third resist pattern R3 is then etched away, and a metal layer 6 of aluminum or the like is formed by the sputtering method or the CVD method. The thickness of the metal layer is determined depending on the level of the current to be supplied. As the layer is thicker, the heat radiation effect is higher and the reliability of wirings is higher. As shown in FIG. 5D, a fourth resist pattern R4 for patterning the metal layer 6 is then formed by the photolithography method.

Thereafter, the metal layer 6 is patterned by an etching process such as RIE.

Finally, a resist pattern (not shown) is formed on the rear face, and an etching process is performed with using the resist pattern as a mask to form a membrane (thin film area). Also in this etching step, the silicon oxide film 2 is used as an etching stopper, whereby overetching can be prevented from occurring, so that a pattern can be accurately formed with excellent controllability.

In this way, the impurity implantation mask 100 is formed.

Next, an ion implanting method using the impurity implantation mask 100 will be described.

Figure 6:
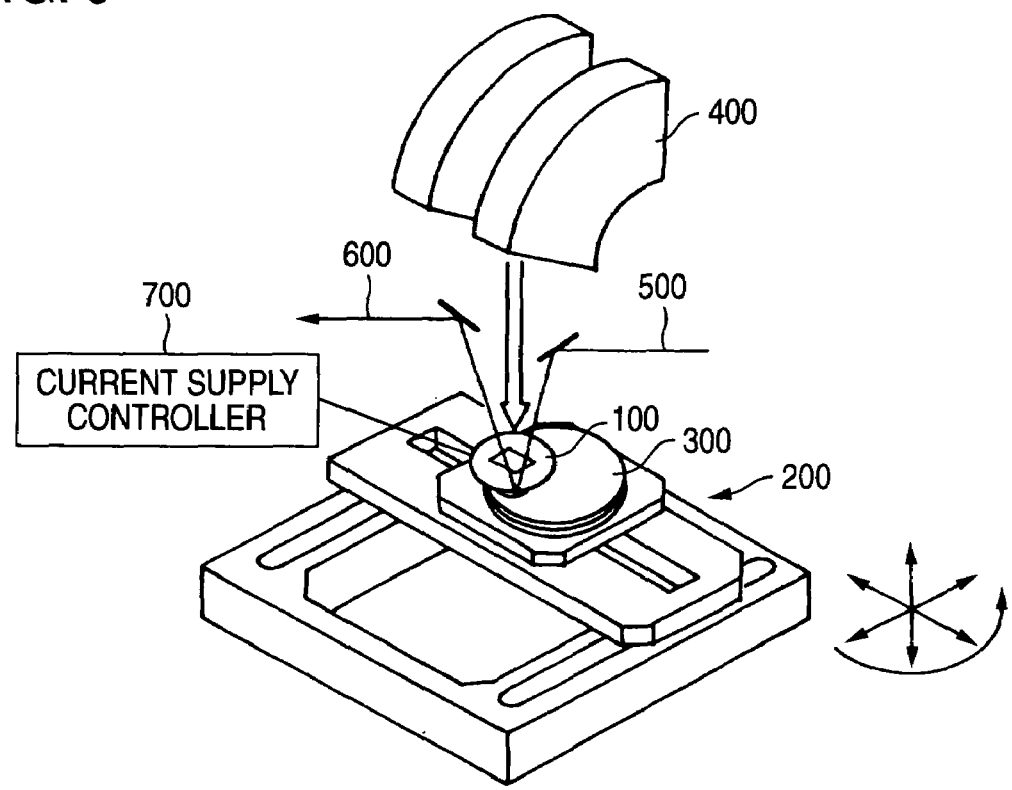
FIG. 6 is a view showing an ion implanting apparatus using the mask.
Figure 7:
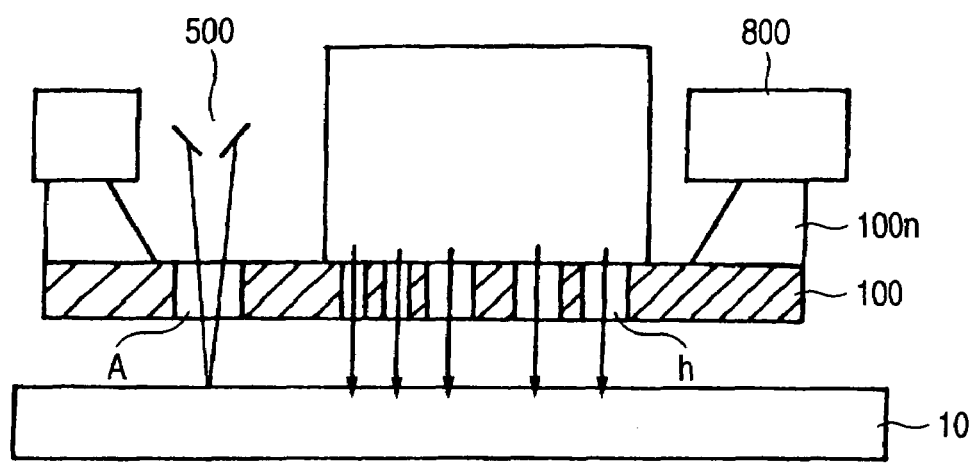
FIG. 7 is a view showing an ion implanting method in the first embodiment of the invention.

The impurity implantation mask 100 is attached to an ion implanting apparatus shown in FIGS. 6 and 7, to be used as a mask in an ion implantation process. FIG. 6 is a perspective view, and FIG. 7 is a section view of main areas.

The ion implanting apparatus comprises: the impurity implantation mask 100; a substrate holding table 200 having an X-Y- stage which positions a to-be-processed substrate 300 with respect to the impurity implantation mask 100; and an ion source 400. The apparatus implants ions from the ion source 400 into the to-be-processed substrate 300 through the impurity implantation mask 100. The mask alignment is performed with using a positioning light source 500 and a CCD camera 600. In the impurity implantation mask 100, as shown in FIG. 1, a Peltier element is formed in the membrane area. A current supply controller 700 adjusts the amount of the current to be supplied to the Peltier element so that the membrane area can maintain the desired temperature. The reference numeral 800 denotes a mask support area.

In the positioning process, while using an alignment optical system 500, positioning is performed with respect to an alignment mark formed on a to-be-processed substrate 10, through an opening A formed in a peripheral area of the impurity implantation mask.

The ion source 400 may be configured by detachably attaching two different ion sources such as a multi-charged ion source and a high-current ion source. In this configuration, desired ion implantation can be easily realized.

Figure 8:
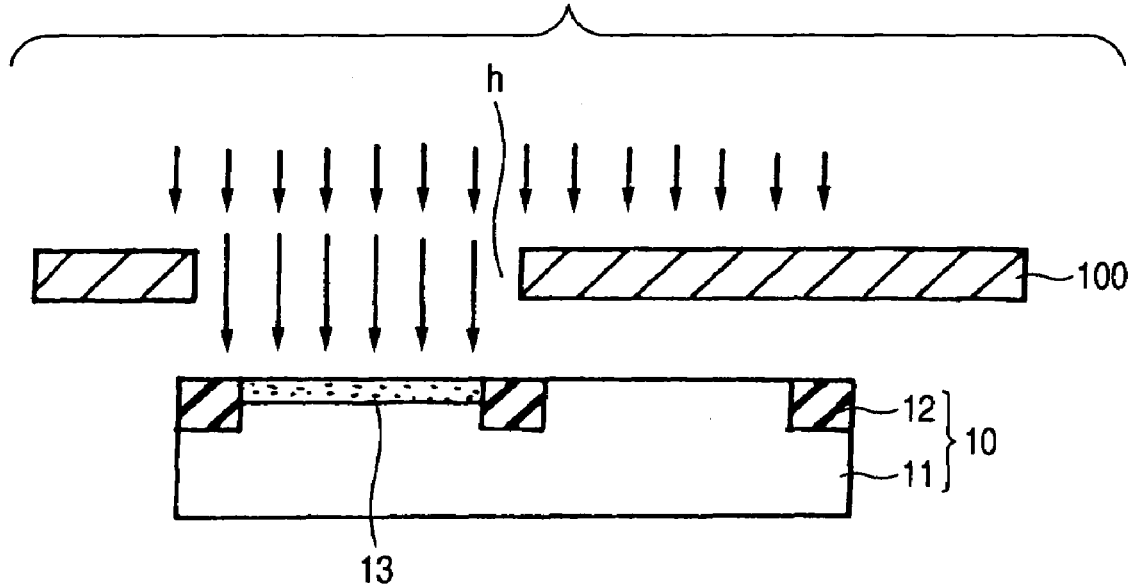
FIG. 8 is a view showing the ion implanting method in the first embodiment of the invention.

With using the ion implanting apparatus, ion implantation is performed on a silicon substrate 11 in which a device isolation insulating film 12 is formed as shown in FIG. 8, to form an impurity region 13.

According to the method, as apparent from comparison with the conventional method shown in FIGS. 18A to 18E, formation of the resist pattern which has been necessary before the ion implanting step, and also separation of the pattern which has been required after the ion implanting step are not necessary, and the steps can be remarkably simplified. Furthermore, the ion implantation can be efficiently performed in a very clean environment.

According to the method, the step of, after a p-well is formed by implanting p-type impurity ions, exchanging the mask and implanting n-type impurity ions to form an n-well can be conducted without forming a resist pattern. Therefore, ions of different conductivity types can be sequentially implanted in a highly efficient manner with exchanging the mask, and without unloading the to-be-processed substrate from the ion implanting apparatus.

Figure 9:
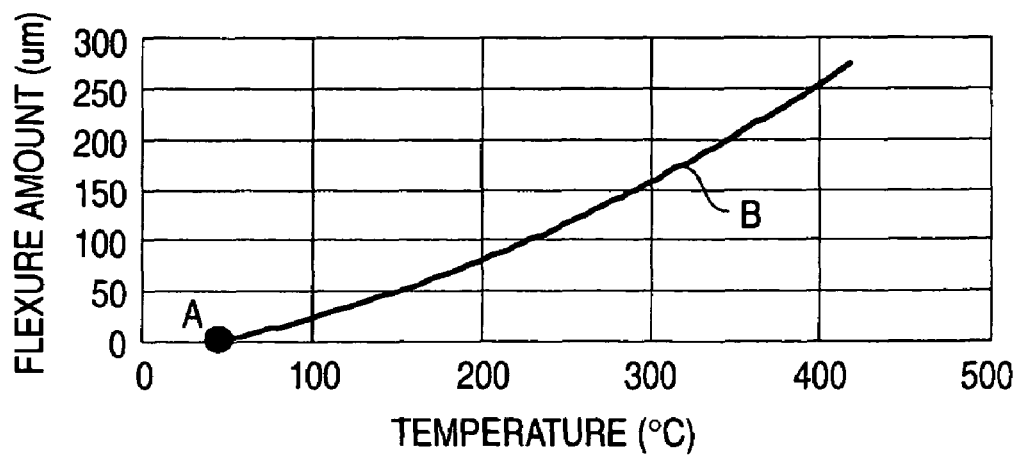
FIG. 9 is a view showing relationships between the dose amount and displacement of a mask in the case where the ion implanting method in the first embodiment of the invention is used.

FIG. 9 shows relationships between the dose amount and the temperature of the mask surface in ion implantation which is performed as described above. As apparent from the figure, in the invention, the surface of the mask is cooled during ion implantation by the Peltier element formed in the mask surface, and hence the mask can be maintained without causing a temperature rise. Therefore, an ion implantation pattern in which the pattern control has been highly accurately performed can be formed without causing warp and distortion in the mask as indicated in the point A.

By contrast, when ion implantation was performed under the same conditions without driving the Peltier element, the distance between the mask and the wafer is increased as indicated by the line B in FIG. 9. Therefore, it will be seen that the mask warps and a pattern error is produced.

Second Embodiment

Next, a second embodiment will be described.

The embodiment is characterized in that the surface temperature of an ion implantation mask is maintained constant while the temperature of the mask surface is measured by a temperature sensor formed in the surface of the substrate of the ion implantation mask.

As shown in FIG. 10, the ion implantation mask comprises a temperature sensor 100c using a pn junction which is formed in the same step as p-type impurity regions 5 and n-type impurity regions 4 constituting a Peltier element 100PE. The temperature difference is measured by measuring the current flowing through the sensor and the potential difference between terminals. When a constant current forward flows through a pn junction of a semiconductor, the temperature dependency of the potential difference between terminals is approximately determined by the physical properties of a semiconductor substrate. In the case of silicon, the dependency is about −2 mV/C. When a constant current is supplied to the temperature sensor and the potential difference between terminals is measured, the temperature variation can be easily monitored.

According to the configuration, the temperature of the mask surface is measured by the sensor 100c which is formed on the same substrate as and by the same step as the pn junction constituting the Peltier element 100PE for controlling the temperature. Therefore, an accurate temperature control is enabled, and it is possible to obtain a photomask which is free from a pattern error.

Third Embodiment

Next, a third embodiment will be described.

The embodiment is an example having a pattern in which a pn junction of an impurity implantation mask is enlarged. As shown in FIG. 11, a relatively shallow diffusion pattern 34 which is formed in a comb tooth-like shape is formed in a well region 35 that is relatively deeply formed. According to the configuration, the area of the pn junction surface can be made very larger than that in the first embodiment.

The reference numeral 36P denotes a contact for the well, and 36N denotes a contact for the comb-tooth pattern.

In the embodiment, the area of the pn junction can be increased to the maximum degree, and hence the temperature can be efficiently controlled.

Fourth Embodiment

Next, a fourth embodiment will be described.

Figure 12:
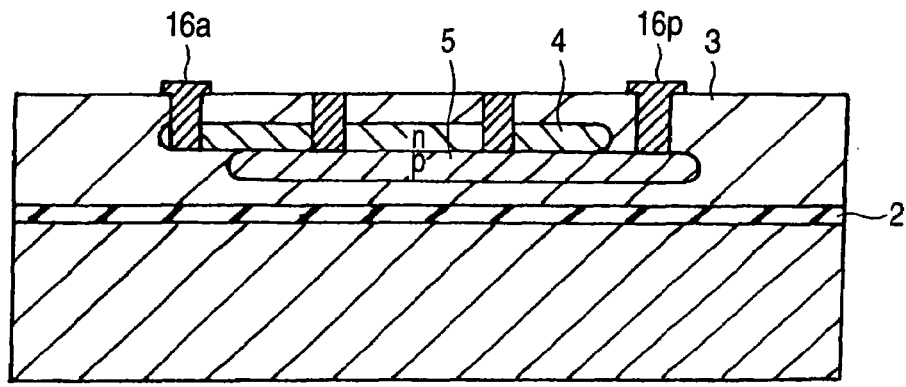
FIG. 12 is a view showing a mask of a fourth embodiment of the invention.

In the embodiment, as shown in FIG. 12, a pn junction of an impurity implantation mask is formed in the depth direction.

In this configuration, an n-type impurity region 4 is formed at a predetermined depth from the surface of a substrate, and a p-type impurity region 5 is formed at a lower level so as to form a pn junction surface, and a current is supplied via terminals 16a, 16b to cool the junction face.

The relationship between the p- and n-type regions may be changed so that the region 4 is of the p-type and the region 5 is of the n-type.

According to the configuration, the pn junction can be uniformly formed in the pattern formation plane, and the temperature dispersion in the plane can be reduced.

Next, a method of producing the impurity implantation mask will be described.

Figure 13A:
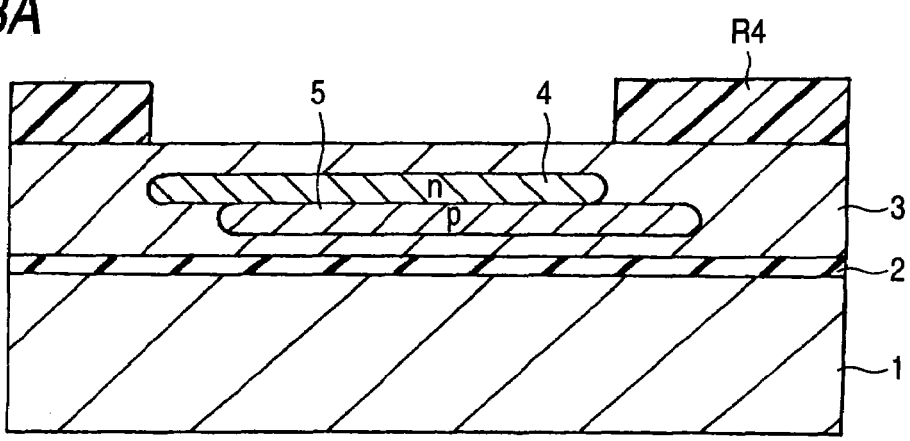
FIGS. 13A and 13B are views showing steps of producing the mask of the fourth embodiment of the invention.
Figure 13B:
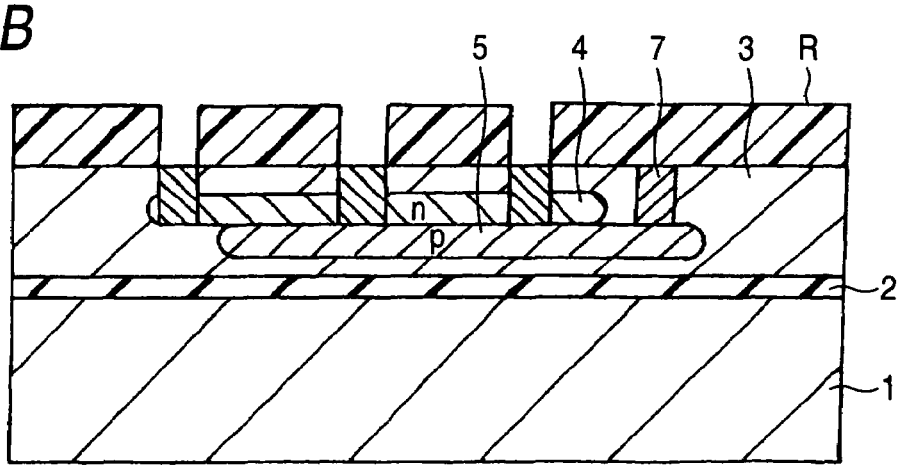

FIGS. 13A and 13B are views showing production steps.

In the same manner as the first embodiment, first, a non-doped silicon substrate is bonded by the direct bonding method to the silicon substrate 1 via the silicon oxide film 2 formed on the surface of the substrate, and then polished to a desired thickness, whereby a non-doped silicon layer 3 is formed (formation of the SOI substrate).

While using the SOI substrate as a starting material, as shown in FIG. 13A, p-type impurity ions are implanted with using a resist pattern (not shown) as a mask to form the p-type impurity region 5 at a predetermined depth of the non-doped silicon layer 3. Next, n-type impurity ions are implanted with using another resist pattern R4 as a mask to form the n-type impurity region 4.

The resist pattern R4 is then peeled off, and activation such as RTA is performed at 1,000.C for about 30 seconds. As shown in FIG. 13B, thereafter, a resist pattern R for forming contacts is formed, contact holes are formed by RIE, and the contact holes are filled with a metal electrode of aluminum or the like. As a result, a contact layer 7 is formed.

In place of the contact layer, a heavily-doped impurity region may be configured. In this case, a contact layer 7 is formed on the p-side and another contact layer 7 is formed on the n-side so as to contact with the p- and n-type impurity regions, respectively.

Thereafter, a resist pattern for forming a mask pattern is formed, and an etching process is performed by RIE with using the silicon oxide film 2 as an etching stopper, thereby forming the holes h.

Then, wiring layers such as aluminum layers are formed on the contact layer 7 to form the terminals 16a, 16b.

Finally, as shown in FIG. 12, a resist pattern (not shown) is formed on the rear face, and an etching process is performed with using the resist pattern as a mask to form a thin region constituting the membrane area. Also in this etching step, the silicon oxide film 2 is used as an etching stopper, whereby overetching can be prevented from occurring, so that a pattern can be accurately formed with excellent controllability.

The relationship between the p- and n-type regions may be inverted.

In this way, an impurity implantation mask is formed.

Fifth Embodiment

Next, a fifth embodiment will be described.

Figure 14:
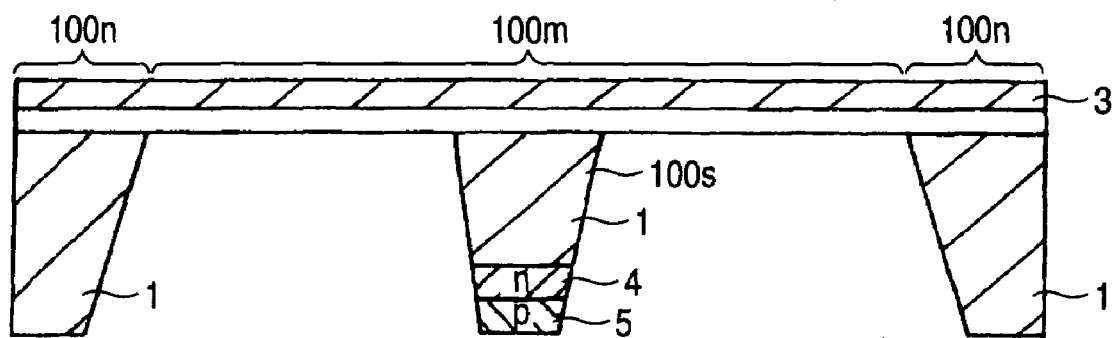
FIG. 14 is a view showing a mask of a fifth embodiment of the invention.

In the embodiments described above, the pn junction is formed in the plane constituting the membrane area 100m, so as to perform the cooling operation. By contrast, in the present embodiment, as shown in FIG. 14, a partial support area 100S remains in the membrane area of an ion implantation mask, and the pn junction is formed in the partial support area, so as to perform the cooling operation.

In the production, p- and n-type impurity regions are formed on the side of the rear face of a silicon substrate by ion implantation, a resist pattern which allows the frame-like support area and the partial support area to remain after the etching step for forming the membrane area is formed, and an etching process is then performed.

When the pn junction is formed at a deep position of the partial support area and in a plane which is parallel with the surface of the membrane area, it is possible to provide a stencil mask in which the pn junction characteristics are hardly affected by residual ion beam impurities in the vicinity of the surface of the membrane area, and which has a longer life and high reliability.

Sixth Embodiment

Next, a sixth embodiment will be described.

Figure 15:
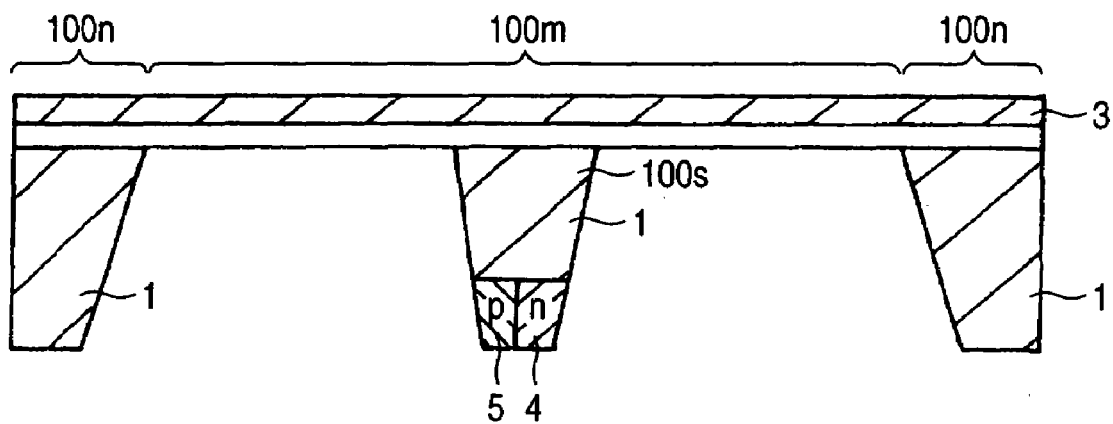
FIG. 15 is a view showing a mask of a sixth embodiment of the invention.

In the fifth embodiment, the pn junction surface which is parallel with the plane of the partial support area 100S is formed. By contrast, in the present embodiment, as shown in FIG. 15, a pn junction surface which is perpendicular to the plane of the partial support area 100S is formed.

The other areas are identical with those of the fifth embodiment.

In the embodiment, the pn junction is formed in the partial support area, and on the plane which is perpendicular to the surface of the membrane area. Therefore, the junction circumferential length can be increased by applying microprocessing. This configuration has an advantage that a mask of a high cooling efficiency can be provided.

Seventh Embodiment

Next, a seventh embodiment will be described.

Figure 16:
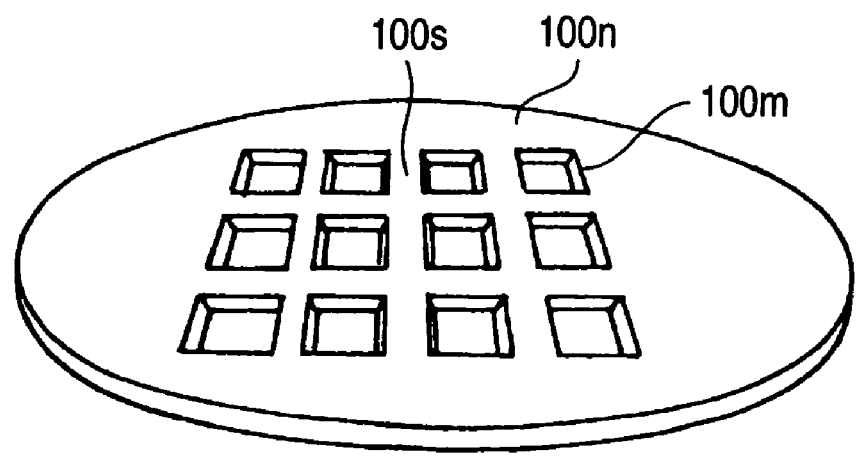
FIG. 16 is a view showing a mask of a seventh embodiment of the invention.

The invention can applied also to a mask which is configured by a plurality of pattern regions. As shown in FIG. 16, a pattern may be divided into a plurality of pattern regions, and a plurality of membrane areas 100m which are supported by a support area 100S may be formed into a lattice like arrangement. The reference numeral 100n denotes a frame-like support area. In this case, when a dicing region of a wafer is formed so as to correspond to the support areas, no influence is applied to the process, so that a wafer process of a high yield is enabled.

Eighth Embodiment

Next, an eighth embodiment will be described.

Figure 17A:
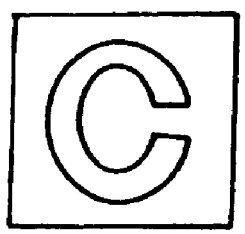
FIGS. 17A to 17C are views showing a mask of an eighth embodiment of the invention.
Figure 17B:
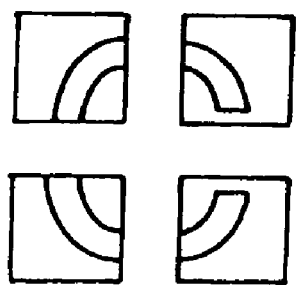
Figure 17C:
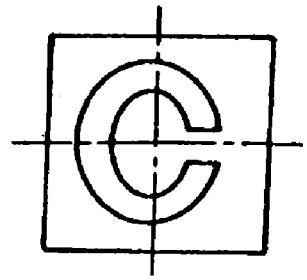
Figure 18A:
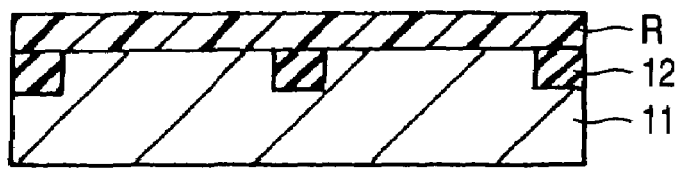
FIGS. 18A to 18E are views showing an ion implanting method of a conventional art example.
Figure 18B:
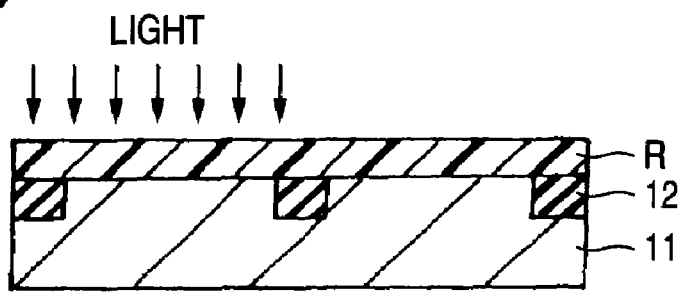
Figure 18C:
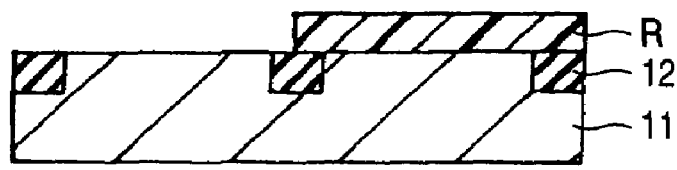
Figure 18D:
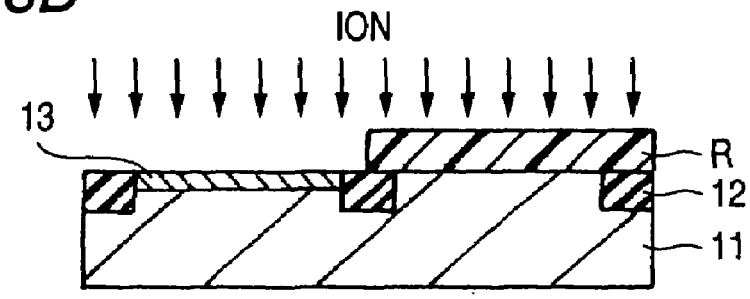
Figure 18E:
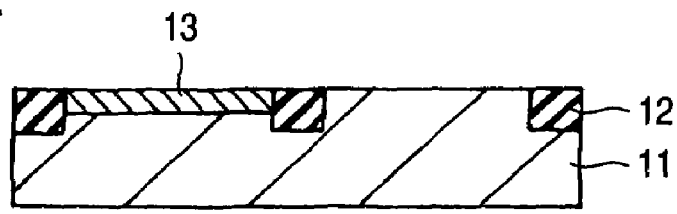
Figure 19:
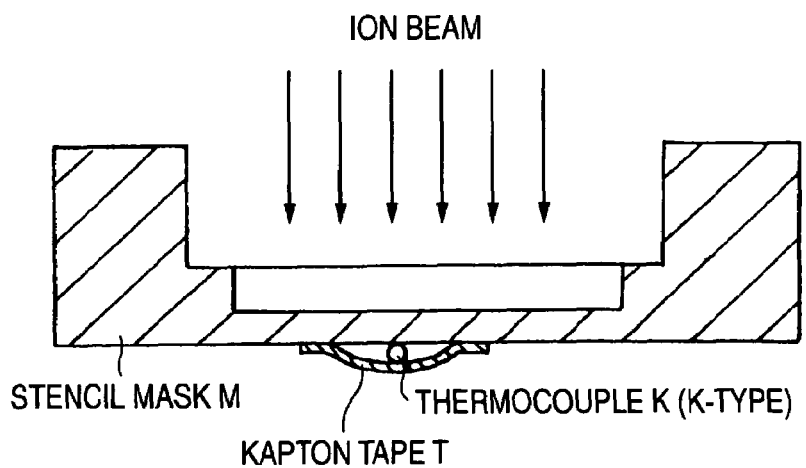
FIG. 19 is a view showing deformation of a stencil mask in an ion implanting step in the conventional art example.
Figure 20:
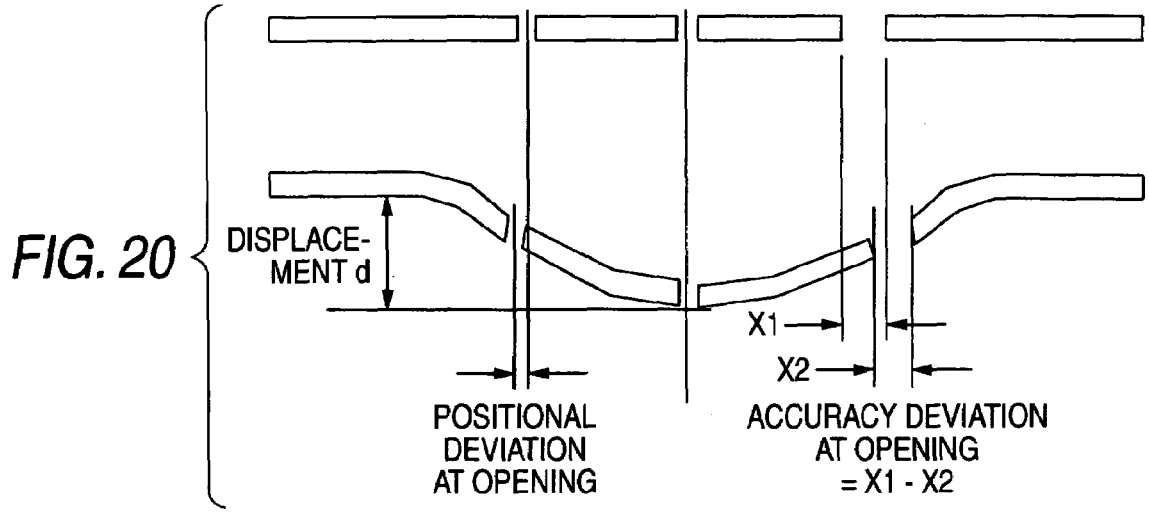
FIG. 20 is a diagram showing deviation of a mask pattern in deformation of the stencil mask.
Figure 21:
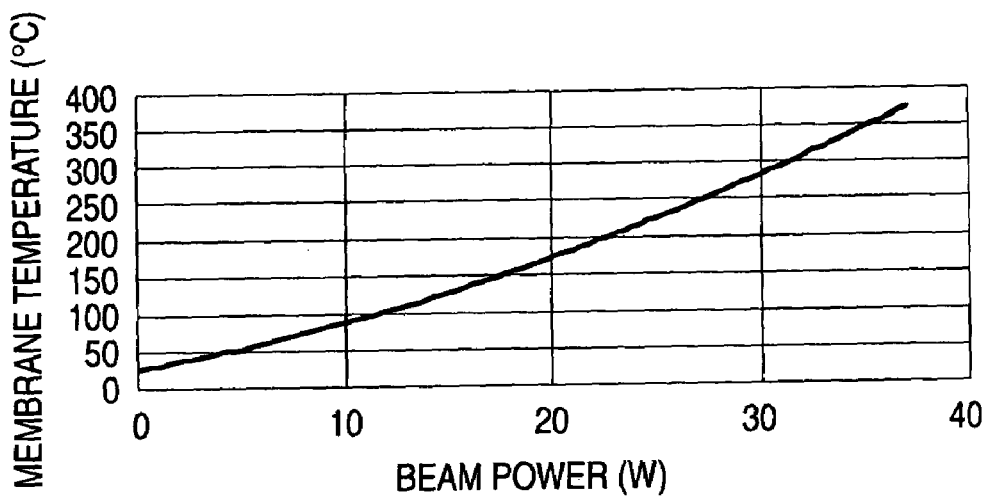
FIG. 21 is a view showing relationships between the temperature of a membrane area and the beam power.
Figure 22:
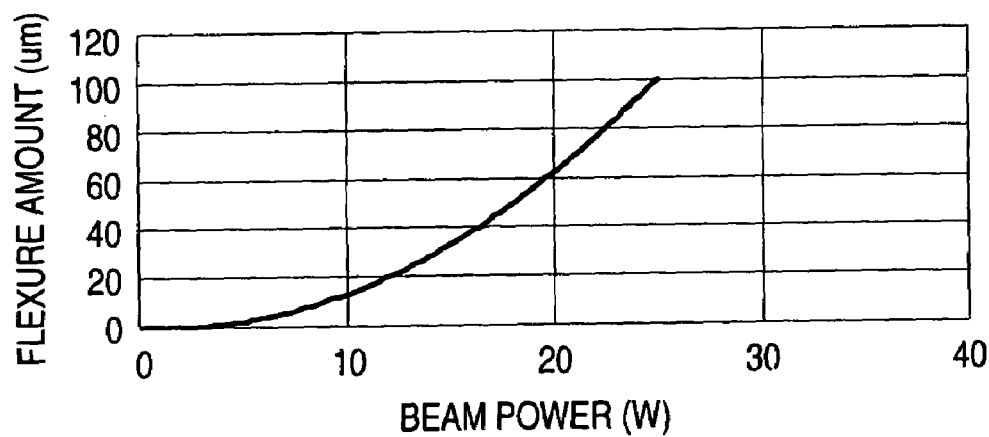
FIG. 22 is a view showing relationships between the amount of flexure of a mask and the beam power.

In some patterns, such divisional configuration cannot be formed. In this case, a division shape may be formed as shown in FIGS. 17A to 17C.

With using a stencil mask which is formed as described above, therefore, an accurate impurity profile can be continuously obtained with excellent workability and without conducting a photolithography step.

As described above, according to the invention, a mask which is highly accurate and reliable can be formed.

According to the invention, an accurate mask can be easily formed by a usual semiconductor process with using silicon or the like.

According to the method of producing a semiconductor device of the invention, formation of an ion implanted region and the like can be easily performed without conducting steps of forming a resist pattern, exposing the pattern, and separating the resist pattern.

Moreover, it is possible to provide a semiconductor device in which, even when ions of different conductivity types are to be implanted, the implantations can be continuously performed in the same chamber without breaking vacuum, and hence the workability is very excellent, and which is free from contamination and highly reliable.

What is claimed is:

1. A mask comprising:
   a plate-like member having a mask pattern area and a pn junction; and a current supplying area which supplies a current to said pn junction, wherein a Peltier effect is caused by supplying a current to said pn junction so that a temperature of said mask pattern area can be controlled, and said plate-like member comprises: a thin membrane area having said mask pattern area; and a frame-like support area at a periphery of said membrane area, said pn junction being formed continuously and repeatedly in parallel with the membrane area.

2. A mask according to claim 1, wherein said mask pattern area is a stencil mask for ion implantation in which ions are allowed to be passed through openings thereof.

3. A mask according to claim 1, wherein said mask pattern area is functioning as a cooling surface by the Peltier effect.

4. A mask according to claim 1, wherein said membrane area and said support area are configured by a single semiconductor substrate.

5. A mask according to claim 4, wherein said membrane area is configured by a silicon thin film.

6. A mask according to claim 4, wherein said membrane area is configured by a silicon carbide thin film.

7. A mask according to claim 4, wherein said membrane area is configured by a diamond thin film.

8. A mask according to claim 1, wherein said pn junction is configured by stripe-like p- and n-type impurity regions which are formed in a surface of said plate-like member to be parallel with each other.

9. A mask according to claim 1, wherein said pn junction is configured by a relatively shallow diffusion pattern which is formed in a comb tooth-like shape in a well region that is relatively deeply formed in a surface of said plate-like member.

10. A mask according to claim 1, wherein said pn junction is formed at a predetermined depth from a surface of said plate-like member and in parallel with said surface.

11. A mask according to claim 1, wherein said mask further comprises a temperature detecting area on said semiconductor substrate, said temperature detecting area being configured by a pn junction.

12. A mask according to claim 11, wherein said pn junction of said temperature detecting area is configured by a diffusion layer which is formed in a same step as a diffusion layer constituting said pn junction of said membrane area.

13. A mask according to claim 11, wherein said temperature detecting area is formed on a surface of a frame-like support area (beam) which is formed to be thicker than said membrane area.

14. A mask according to claim 1, wherein said pn junction is formed in said mask pattern area.

15. A mask according to claim 1, wherein said pn junction is formed in a partial support area (beam) which is formed in a region of said mask pattern area excluding said openings, and which has a thickness that is substantially equal to a thickness of said frame-like support area.

16. A mask according to claim 15, wherein said pn junction is formed in said partial support area, and on a plane which is parallel with a surface of said membrane area.

17. A mask according to claim 15, wherein said pn junction is formed in said partial support area, and on a plane which is perpendicular to a surface of said membrane area.

18. A mask according to claim 1, wherein the frame-like support area is thicker than the thin membrane area.

19. A method of producing a mask comprising the steps of:

implanting impurity ions into a surface of a semiconductor substrate to form at least one pn junction;

forming openings in said surface of said semiconductor substrate to form a mask pattern area; and forming a current supplying area which supplies a current to said pn junction to cause a Peltier effect, said mask being formed in plate-like member that comprises: a thin membrane area having said mask pattern area; and a frame-like support area at a periphery of said membrane area, said pn junction being formed continuously and repeatedly in parallel with the membrane area.

20. A method of producing a semiconductor device comprising:

a step of positioning a mask according claim 1 on a surface of a to-be-processed substrate, and attaching said mask to said surface; and a process step of selectively applying a physical process or a chemical process through said mask to said to-be-processed substrate.

21. A method of producing a semiconductor device according to claim 20, wherein said process step includes a step of selectively implanting ions into said surface of said to-be-processed substrate, in regions corresponding to said openings of said mask.

22. A method of producing a semiconductor device according to claim 20, wherein said process step includes the steps of:

attaching a first mask in which a desired opening pattern is formed, to said surface of said to-be-processed substrate, and implanting first impurity ions into said surface of said to-be-processed substrate, in regions corresponding to openings of said first mask; and attaching, in place of said first mask, a second mask, to said surface of said to-be-processed substrate into which said first impurity ions are implanted, and implanting second impurity ions into said surface of said to-be-processed substrate, in regions corresponding to openings of said second mask.

23. A method of producing a semiconductor device according to claim 20, wherein said process step includes a step of selectively etching said surface of said to-be-processed substrate, in regions corresponding to said openings of said mask.

24. A method of producing a semiconductor device according to claim 20, wherein said process step includes a film growing step of selectively forming a thin film on said surface of said to-be-processed substrate, in regions corresponding to said openings of said mask.

25. A method of producing a semiconductor device according to claim 20, wherein said process step includes an exposure step of selectively exposing a resist formed on said surface of said to-be-processed substrate, in regions corresponding to said openings of said mask.

* * * * *